United States Patent
Adnan

[19]

[11] Patent Number: 5,862,040
[45] Date of Patent: Jan. 19, 1999

[54] SMART PALLET FOR BURN-IN TESTING OF COMPUTERS

[75] Inventor: Sarmad Adnan, Alvin, Tex.

[73] Assignee: A.I.M., Inc., Houston, Tex.

[21] Appl. No.: 792,782

[22] Filed: Feb. 3, 1997

[51] Int. Cl.$^6$ .................................................. H05K 7/02
[52] U.S. Cl. ........................ 361/809; 361/807; 361/826; 361/827; 361/829; 361/683; 361/725; 324/75.7; 324/73.1; 324/158.1; 324/760; 219/209; 371/22.1
[58] Field of Search ..................................... 361/809, 807, 361/679, 680, 681, 683, 684, 685, 686, 724, 727, 725, 829, 826, 827; 324/757, 73.1, 158.1, 760; 219/209; 371/22.1

[56] References Cited

U.S. PATENT DOCUMENTS

| | | | |
|---|---|---|---|
| 4,348,276 | 9/1982 | Tateishi | 209/573 |
| 4,506,213 | 3/1985 | O'Connor | 324/158 F |
| 4,724,383 | 2/1988 | Hart | 324/158 F |
| 4,746,861 | 5/1988 | Nesbitt | 324/158 F |
| 4,777,434 | 10/1988 | Miller et al. | 324/757 |
| 4,888,549 | 12/1989 | Wilson et al. | 324/73.1 |
| 5,051,944 | 9/1991 | Fetterolf et al. | 364/900 |
| 5,093,982 | 3/1992 | Gussman | 29/705 |
| 5,126,657 | 6/1992 | Nelson | 324/158 F |
| 5,184,068 | 2/1993 | Twigg et al. | 324/755 |
| 5,192,907 | 3/1993 | Bonaria | 324/158 F |
| 5,268,637 | 12/1993 | Liken et al. | 324/158 F |
| 5,315,240 | 5/1994 | Jones | 324/158 F |
| 5,329,093 | 7/1994 | Okano | 219/209 |
| 5,355,579 | 10/1994 | Miyasaka et al. | 29/712 |
| 5,420,523 | 5/1995 | Walker et al. | 324/772 |
| 5,443,534 | 8/1995 | Vinviarelli | 29/593 |

OTHER PUBLICATIONS

Touch Connections Catalog, Dallas Semiconductor, pp. 21–23, prior to Feb. 1997.

Primary Examiner—Leo P. Picard
Assistant Examiner—David Foster
Attorney, Agent, or Firm—Pravel, Hewitt & Kimball

[57] ABSTRACT

A transport pallet is provided for automating pre-shipment testing or "burn-in" of personal computers. The transport pallet is adapted to receive and transport the computer from an assembly line to a test storage location or bin. The pallet also provides on-board connections by which both operating power and computer signals are furnished to the personal computer at the test storage location. The pallet is adapted to engage external power supply terminals and external computer signal inputs at the test location. The pallet furnishes both power and test signals to the personal computer and return responses of the computer through the on-board connections, permitting "burn-in" testing of the computer while it is located in the test storage bin.

26 Claims, 5 Drawing Sheets

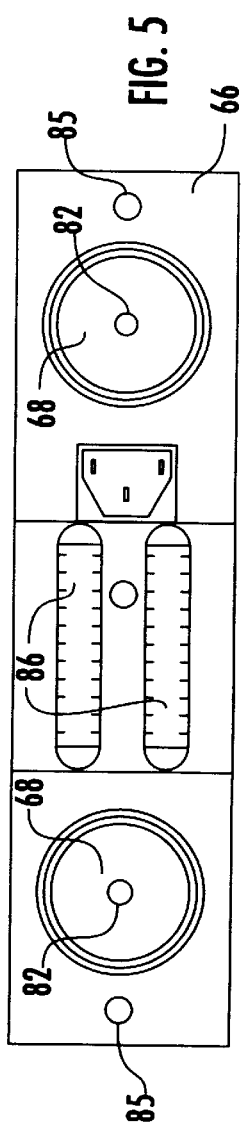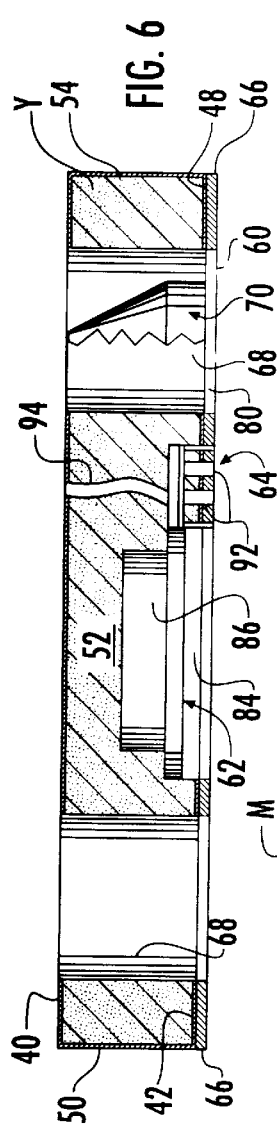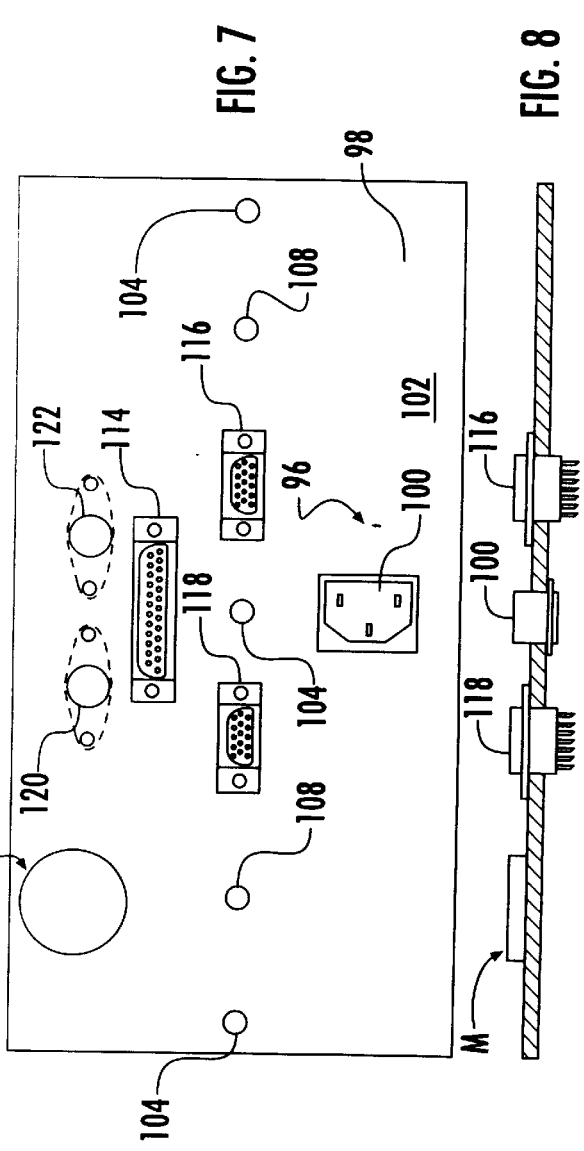

SMART PALLET FOR BURN-IN TESTING OF COMPUTERS

BACKGROUND OF INVENTION

1. FIELD OF INVENTION

The present invention relates to automated, post-assembly testing of personal computers and the like.

2. DESCRIPTION OF PRIOR ART

After a personal computer has been assembled, the most probable time for any computer chip of the computer to fail prematurely is during its initial few hours of operation. For this reason, it has become a common practice for personal computer manufacturers to subject the computer at the assembly site to an initial period of operation known as a "burn-in" cycle. The personal computer is connected to a source of operating power and also to a source of computer operating or test codes. The computer is then allowed to run for a specified time, usually several hours, for initial testing.

So far as is known, this type of testing has not been particularly suitable for automated testing of computers on a mass production basis. The computers after assembly were connected at test stations and operated, usually with a few computers per test station. This, however, required a test technician to monitor the progress of each computer at the test station and thus fairly expensive in labor costs. Additionally, if a computer exhibited a problem during "burn-in," the typical practice was to return it for further check out or testing. However, this was typically done with no indication of the likely source of the problem or of the portion of the test cycle in progress when the problem occurred. With a relatively small number of computers assigned to each test station, keeping track of the computers being tested and their operating status was not burdensome or involved. However, as noted this has made the "burn-in" testing process expensive. Keeping track of the mass produced personal computers and their progress as individual modules through "burn-in" or automated post-assembly testing has thus been difficult and involved.

SUMMARY OF INVENTION

Briefly, the present invention provides a new and improved transport pallet for "burn-in" or automated, post-assembly testing of electronic components, such as personal computers. A transport pallet according to the present invention includes a support tray which has an upper surface on which the component being tested is placed. A communication harness is mounted with the support tray for transferring both operating power to the component and test signals between the component and test electronics for testing.

The communication harness of the transport pallet includes signal receptor connectors and signal transfer connectors mounted with the support tray on opposite sides for receiving test signals from a test source and transferring the test signals to the equipment under test. Responses of the equipment during testing are also transferred in return through the signal transfer and receptor connectors. The communication harness also includes power supply connectors and power transfer connectors electrically connected on opposite sides of the support tray together to furnish external operating power to the component during testing.

The signal receptor connectors and the power supply connectors are preferably mounted in a support plate on a lower surface of the support tray. Similarly, the signal transfer and power transfer connectors are preferably mounted in a support plate on an upper surface of the support tray. The support plates on opposite sides of the tray are interconnected by a suitable connection mechanism through the tray.

The present invention also provides an automated post-assembly testing system for the electronic components. The system includes a test rack or frame with a plurality of test bays or shelves. The test shelves have supply terminals with operating power and test signal outlets for testing of the components. With their communication harnesses, the transport pallets do not include any extensions or protrusions which would otherwise hinder their movement and positioning in test shelves of the automated, mass production testing system. The communication harness also includes an alignment guide for ease of automated movement and connection of the support trays into the automated testing system.

BRIEF DESCRIPTION OF THE DRAWINGS

FIG. 5 is a plan view of a portion of the transport pallet of FIGS. 2 and 3.

FIG. 6 is a side elevation view, taken partly in cross-section, of the structure of FIG. 5.

FIG. 7 is a plan view of another portion of the transport pallet of FIGS. 2 and 3.

FIG. 8 is a side elevation view, taken partly in cross-section, of the structure of FIG. 7.

DESCRIPTION OF THE PREFERRED EMBODIMENT

Figure 1:
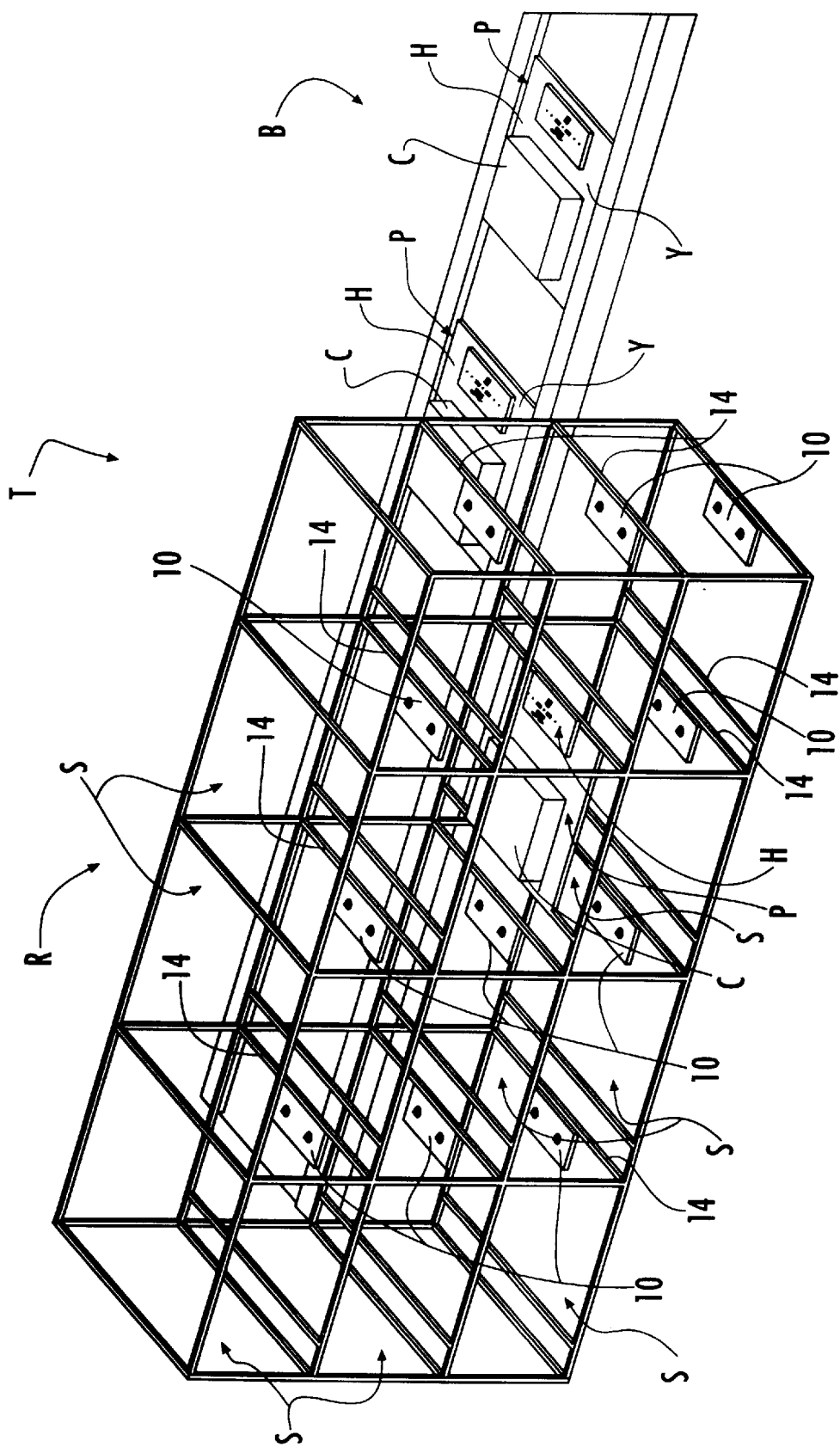
FIG. 1 is an isometric view of an automated computer test facility with transport pallets according to the present invention.

In the drawings, the letter T designates generally an automated post-assembly testing system according to the present invention for automated post-assembly testing or "burn-in" of electronic components. In the preferred embodiment of the present invention, the electronic components being tested by the test system T are personal computers C. As will be set forth, each of the personal computers C is mounted on an individually assigned transport pallet or tray P. Overall control of the test system T resides in an automatic storage and retrieval system (known as an AS/RS) under control of a conventional central process control test computer of the conventional type. A suitable such a commercially available AR/RS system, for example, is of the type available from Daifuku Company of Japan available through Eskay Systems of Salt Lake City, Utah. The process control computer may be of the conventional type, such as Model 503/504 PLC programmable logic controller from Allen-Bradley Corporation.

Each of the transport pallets P receives one of the personal computers C and is adapted to be moved on an automated conveyor belt or roller system B to a test rack R which has a plurality of test shelves S arranged in an assigned bank of rows and columns. Each of the shelves S in the rack R bears an assigned code identifiable number identifying that shelf by its particular location.

Each of the pallets P is assigned uniquely identifiable, electronically sensible indicia which identifies that particular pallet P. Each of the personal computers C is also conventionally assigned its own serial number and model number by the manufacturer during its assembly process. After assembly, each of the personal computers C is placed on a particular transport pallet P and the central test process control computer is provided with the identifying codes of the transport pallet P and serial number or identification number of the personal computer C mounted on the pallet P. The transport pallet P and its associated personal computer C are moved by the conveyor system B to be received on a particular one of the test shelves S of the test rack R. When the pallet P and the computer C are in a particular test shelf, the assigned code number for that shelf is also provided to the central test process control computer. In that manner, the number of the computer and its location are available as test results are obtained.

According to the present invention, the transport pallet P and the test rack R are adapted to provide both operating alternating current electrical power from a suitable source and electronic digital test codes or signals from the central test process computer. The personal computer C thus while in the test rack R assigned to it proceeds through an initial several hours of "burn-in" or post-assembly operation or automated testing. During this "burn-in" or testing time, the personal computer C provides codes through structure provided with the transport pallet P and the test rack R to the central automated test process control computer. In the event a flaw or defect occurs during such testing, the central process control computer can readily provide test personnel with an indication of the particular personal computer C having an operational problem, as well as the location in the test rack R and the nature of the problem. This information is also written to the on board memory chip M. Personnel can then remove the personal computer and its transport pallet P for corrective action.

Figure 2:
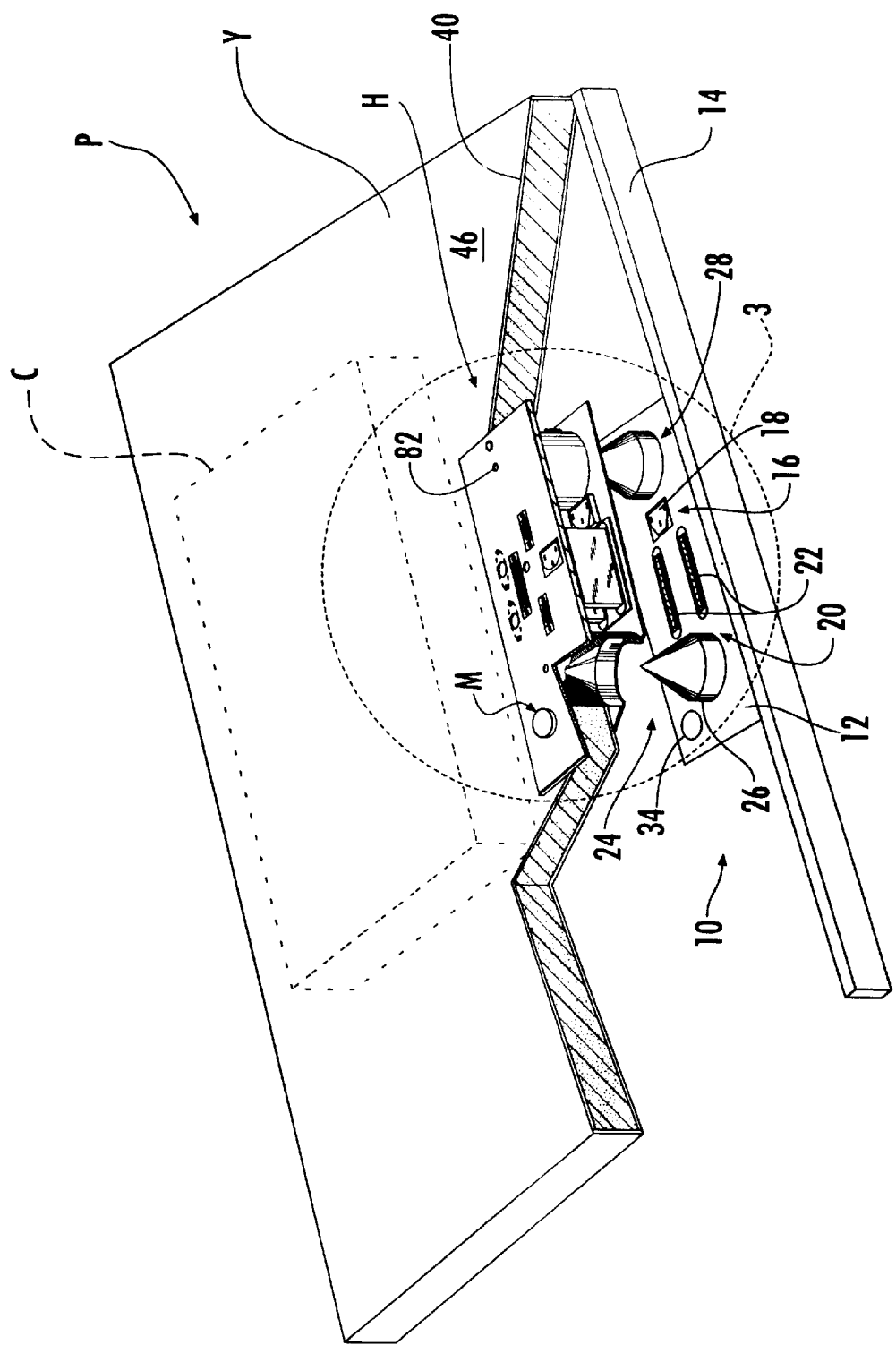
FIG. 2 is an isometric view of a transport pallet according to the present invention mounted in the test facility of FIG. 1.
Figure 3:
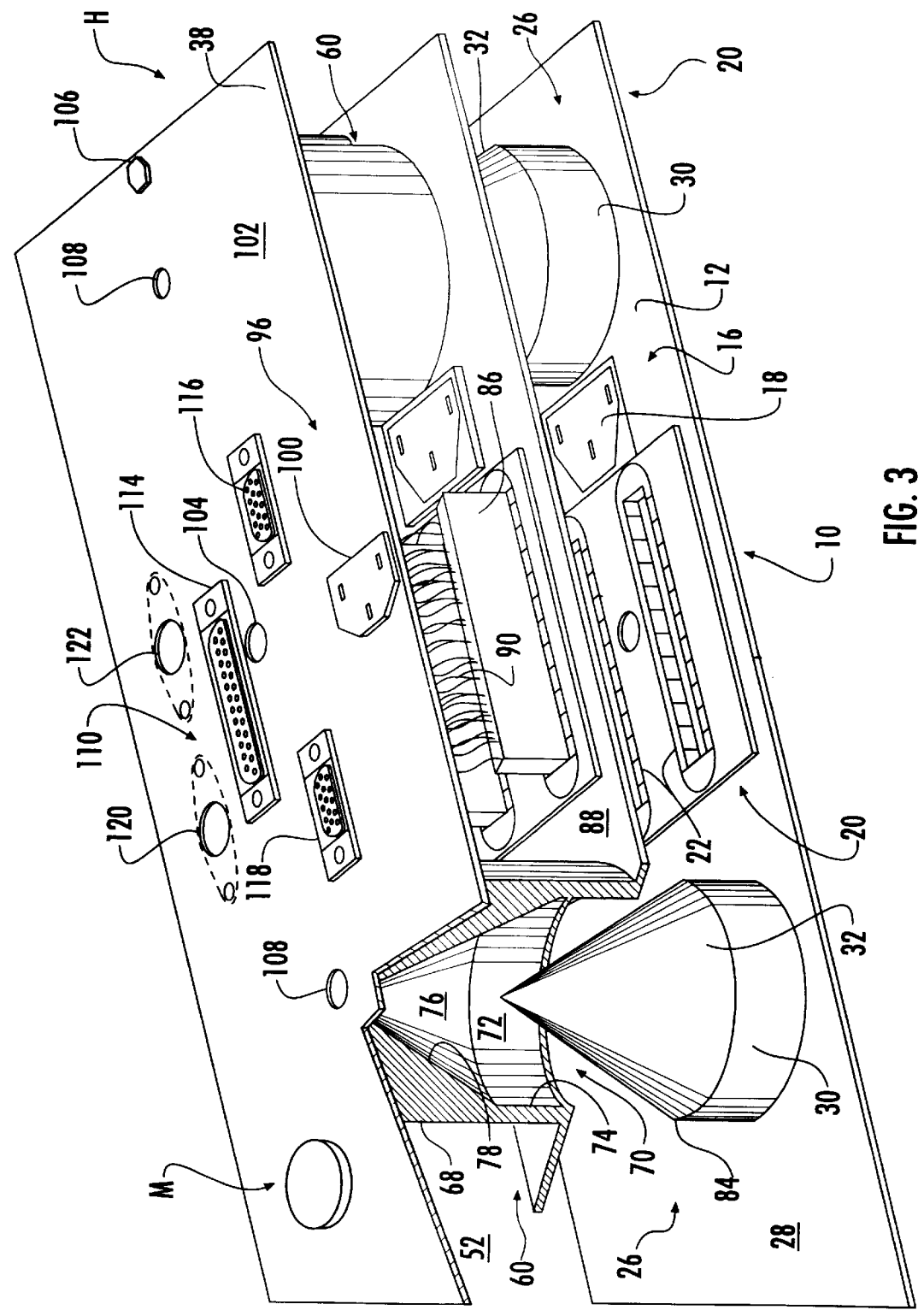
FIG. 3 is an enlarged isometric view of a portion, with certain portions deleted, of the transport pallet of FIG. 2 circled with reference numeral "3" designating same.

Each of the shelves S in the test rack R is provided with a supply terminal 10 (FIGS. 1 and 2). The supply terminal 10 includes a base member or body 12 mounted at a suitable location, such as on a longitudinally inwardly extending beam 14 along one side of each of the shelves S. The base member 12 has a power supply 16 in the form of an alternating current power socket 18 for providing power through a connector harness H (FIGS. 2 & 3) on tray P for the operation of the personal computer C during its "burn-in" testing. The power socket 18 is connected through suitable electrical wiring or conduits mounted in the test rack R to main alternating current power in the test facility where the test system S is in operation.

The supply terminal 10 also includes a test signal source or socket 20 mounted in the base member 12. The test signal socket 20 is in the form of one or more conventional computer connector sockets 22 receiving and transferring digital signals between the central process control computer and each of the personal computers C undergoing "burn-in" testing in the system T. Suitable computer signal transfer conductors mounted in the test rack R carry the digital test signals between the personal computers C and the central process control computer during testing.

The supply terminal 10 also includes a centering mechanism 24 in the form of a set of locating and centering pins 26 (FIG. 3) mounted on an upper surface 28 of the base member 12. At each of the locating pins 26 includes a cylindrical lower body portion 30 extending upwardly from the surface 28 to a generally conical upper contact member 32. The centering mechanism 24 is adapted to insure that the power supply and test signal transfer structure of the connector harness H on the transport pallet P are properly aligned with the supply terminal 10 when the transport pallet P is moved into the shelf S by the conveyor system B. A limit sensor 34, such as a mechanical limit switch or an optical limit sensor, is mounted with the supply terminal 10. The limit sensor or switch operates to sense proper alignment of the communication harness H and the supply terminal 10 and notify the test process control computer of this occurrence.

Figure 4:
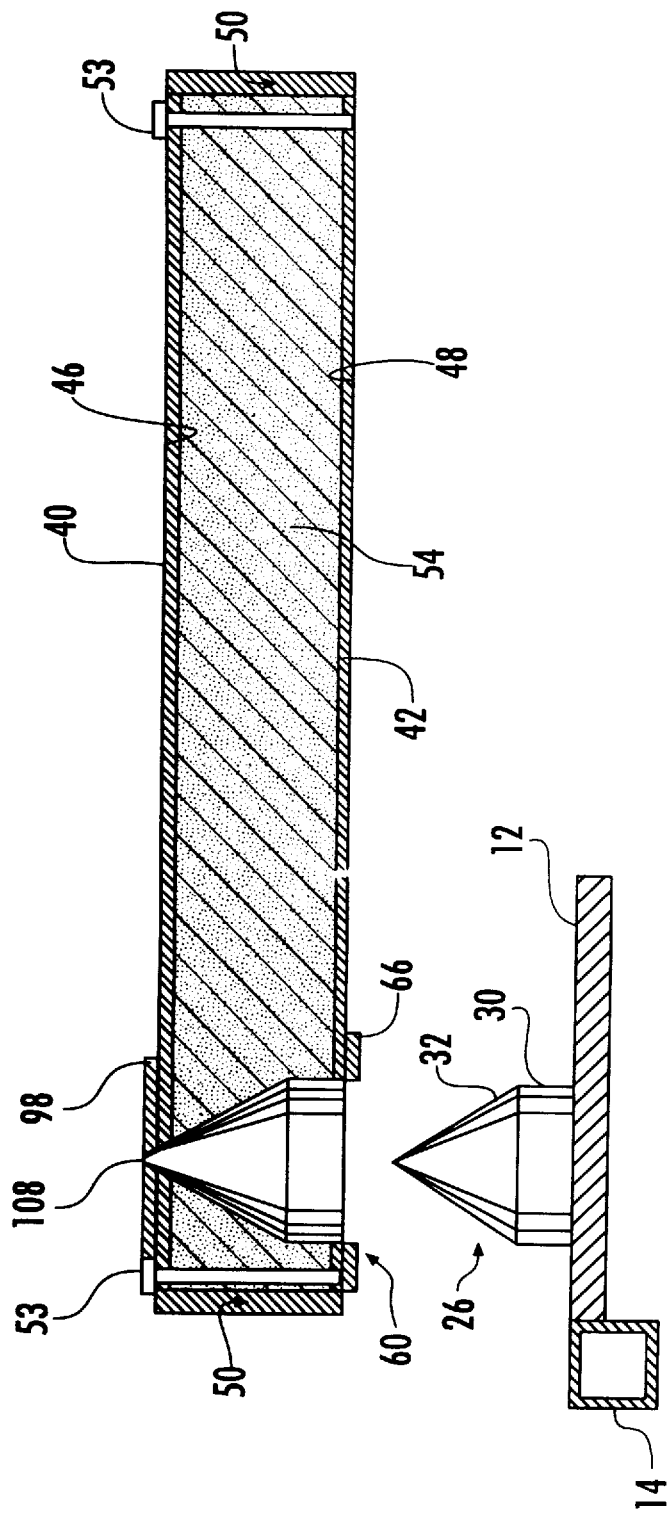
FIG. 4 is an elevation view, taken partly in cross-section of a portion of the structure of FIG. 2.

The transport pallet P includes a support tray Y (FIGS. 2 & 4) in the form of an upper tray shell 40 and lower tray shell 42. The upper tray shelf 40 is adapted to receive the personal computer C on an upper surface 46, while a lower outer surface 48 of the shelf 42 is adapted to ride along the transport or conveyer system B and rest in the shelf S of the test rack R. The tray shelves 40 and 42 are formed and joined together along a mating common peripheral edge border or seam 50 to define an inner space or pocket 52. If desired, connector pins or screws 53 (FIG. 4) may also be used to connect tray shelves 40 and 42 together. The shelves 40 and 42 are preferably formed of a suitable synthetic resin, such as the type known as an ABS plastic, widely available. The inner opening or space 52 of the tray Y is filled with a filler of styrofoam or other suitable foamed synthetic resin 54. The foamed resin is injected through an opening in one of the shelves 40 or 42 after the shelves have been joined at their seam 50. The filler material is not shown in FIG. 3 in order that features of the connection harness H may be more clearly seen.

The communications harness H of the transport pallet P is located on support tray Y to transfer operating power and digital signals from the supply terminal 10 to the personal computer C during "burn-in" testing. The communications harness H includes (FIGS. 5 & 6) a set of alignment sockets 60, a signal receptor connector 62 and power supply connector 64 each mounted extending upwardly from a support plate 66. The support plate 66 is adapted to be mounted on lower surface 48 of the support tray Y so that the alignment socket member 60, receptor connector 62 and power supply connector 64 extend upwardly into the interior space 52 of the tray Y.

Each of the alignment sockets 60 is a generally cylindrical shaped plug or body member 68 having an inner generally cylindrically shaped opening or sleeve 70 formed extending upwardly therein. The opening 70 is formed having an initial or lower cylindrical portion 72 formed adjacent an inner sidewall 74 and an upper conical shaped opening 76 formed adjacent a conical upper wall 78. The sleeve 68 in each of the alignment sockets 60 extends upwardly from a circular opening 80 formed in the support plate 66 and is adapted to receive one of the locating pins 26 of the centering mechanism 24. A central opening or socket 82 is formed extending through an upper center portion of the body 70 above the alignment socket member 60 for passage of a point 84 at an apex or tip of the contact member 32. The point 84 is received in opening 82 when the communication harness H is properly located on the centering mechanism 24. The engagement of conical contact member 32 with the conical inner wall 78 of the body 70 assists in such centering movement.

The support plate 66 also includes a set of connector openings or ports 85 formed extending downwardly through it for attachment of the plate 66 to the support tray Y in a manner to be set forth. The receptor connector 62 includes conventional computer sockets 86 of a number corresponding to the connector sockets 22 in the supply terminal 10.

The connector socket sets 86 include downwardly extending pin members adapted to be fitted in and engaged with respective sockets in the connector sockets 20 (FIG. 3) to both receive and transfer signals between the personal computer C and the central automated process control computer. The connector socket sets 86 are mounted on an upper or inner surface 88 of the support plate 66 and have conductors, as shown at 90, for transferring and conducting such signals. The connectors 90 are not shown in FIG. 6 because of the presence of filler material 54.

The power supply connector 64 includes a set of downwardly extending fingers or plugs 92 (FIG. 6) adapted to fit into corresponding openings in the alternating current power socket 18 of the supply terminal 10. The power supply connector 64 is mounted above the support plate 66 and is connected by a conductor 94 to a power transfer connector 96 mounted in an upper plate member 98 of the communication harness H. The power transfer connector 96 includes an electrical socket 100 facing upwardly from an upper surface 102 of the upper plate member 98. The socket 100 is adapted to receive the conventional alternating current power supply wall plug or terminal of the personal computer C to provide operating power to the computer C during "burn-in" testing thereof The upper plate member 98 has a set of connector openings or ports 104 formed therein which are adapted to be aligned with the ports 85 in the support plate 66. When so aligned, screws, bolts or other attachment mechanisms 106 (FIG. 3) may be inserted to mount the plate member 98 and the lower plate member 66 on the support tray Y. The upper plate member 98 is mounted on the upper surface 46 of the tray Y and the lower plate member 66 is mounted on the lower surface 48 of the tray Y and the attachment mechanisms 106 are inserted through the tray member Y to attach the communications harness H to the tray Y.

The upper plate member 98 also has centering holes or openings 108 formed therein in alignment with the sockets 82 of the alignment socket member 60. In this manner, the tips 84 of the contact members 32 of the locating pins 26 are engaged with the upper plate member 98.

A set of signal transfer connectors 110 of the communications harness H is mounted extending above the upper surface 102 of the upper plate member 98. The signal transfer connectors 110 are connected to the conductors 90 below the upper plate 98 and are adapted to receive the conventional connectors from the personal computer C in their upper connector pins extending upwardly from the upper surface 112 of the upper plate member 98 within the connector members 110. The signal transfer connectors 110 thus transfer digital code signals to and from the personal computer P during "burn-in" testing under control of the central computer for automated testing.

The number and type of signal transfer connectors 110 depend upon the type of personal computer P being used with the transport pallet P. However, typically, the signal transfer connectors 110 include a parallel transfer connector 114 for connection to and transfer of signals through the parallel interface of the personal computer C; a serial transfer connector 116 for transfer of signals with the personal computer serial interface; and a local area network (or LAN) interface connector 118 for transfer of signals with the local area network interface of the personal computer C. Also, as indicated schematically at 120 and 122, the communications harness H may also be adapted to receive other computer signal interface connectors as well.

The transport pallet P of the present invention is also provided with an on-board data memory capability in a memory chip M. The memory chip M is mounted don the upper plate member 98 at a suitable location, and is preferably in the form of a read only memory (ROM). A suitable such memory, for example, is a DS1990A touch memory button available from Dallas Semiconductor. This type of memory is capable of having its data contents read by a sensor probe in contact with the chip outer surface. The memory chip M is electrically connected to the signal transfer connectors 110 and through them to the personal computer C being tested on the pallet P. The memory chip M is also in electrical connection through the receptor connectors to the burn-in test control computer. The memory chip M thus receives and stores signals indicative of the progress of the computer C through the various stages of the burn-in process.

In the event of a malfunction or error during burn-in testing, memory chip M contains within its data contents signals indicative of the problem that occurred and the stage of burn-in when it occurred. The contents of the touch memory chip M can also be read at this time by a testing technician using a sensor probe. The test technician can thus read the memory chip M and quickly determine the problem or defect detected during burn-in.

In the operation of the present invention, the individual computers C are each placed on an assigned pallet P in the conveyor system B after assembly is completed. The computer C is then connected to the power transfer connector 100 and signal transfer connectors 110 in the harness H. Appropriate identifier codes for the computer C and its tray P are made in the process control computer. The trays P are then transported and loaded in the individual shelves S. As the tray P moves into the shelf S, the centering mechanism 26 insures proper alignment between the harness H and supply terminal 10. The weight of the computer C causes the power supply connector 64 and receptor connector 62 of the harness H to connect with the power supply socket 18 and test signal socket 20 of supply terminal 10. The computer C then begins its automated "burn-in" testing under control of the process control computer. As noted above, the identity and location of each computer C, as well as its progress and status during testing, are available and under control of the test facility process control computer.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

I claim:

1. A transport pallet for a personal computer during post-assembly testing, comprising:

a support tray having an upper surface on which the personal computer being tested is placed; and a communication harness mounted with said support tray for transferring operating power and test signals to the personal computer for testing.

2. The transport of claim 1, wherein said communication harness comprises:

receptor connectors mounted with said support tray for receiving test signals for testing the personal computer; and transfer connectors mounted with said support tray in communication with said receptor connectors for transferring test signals to the personal computer for testing.

3. The transport pallet of claim 2, wherein:

said receptor connectors are mounted with a support plate formed on an upper surface of said support tray; and said transfer connectors are mounted with a support plate formed on a lower surface of said support tray.

4. The transport pallet of claim 3, wherein said support plates of said receptor connectors and said transfer connectors are aligned in a common vertical plane on said surfaces of support tray.

5. The transport pallet of claim 4, further including:

a connector mechanism extending through said support tray and interconnecting said support plates of said receptor connectors and said transfer connectors.

6. The transport pallet of claim 2, wherein said personal computer has a parallel interface and said transfer connectors include:

a parallel transfer connector for transferring test signals to the personal computer parallel interface.

7. The transport pallet of claim 2, wherein said personal computer has a serial interface and said transfer connectors include:

a serial transfer connector for transferring test signals to the personal computer serial interface.

8. The transport pallet of claim 2, wherein said personal computer has a local area network interface and said transfer connectors include:

a local area network transfer connector for transferring test signals to the personal computer local area network interface.

9. The transport of claim 1, wherein said communication harness comprises:

power supply connectors mounted with said support tray for receiving external operating power for the personal computer during testing; and power transfer connectors in electrical connection with said power supply connectors for furnishing the external operating power to the personal computer during testing.

10. The transport pallet of claim 9, wherein said communication harness comprises:

said power supply connectors are mounted with a support plate formed on an upper surface of said support tray; and said power transfer connectors are mounted with a support plate formed on a lower surface of said support tray.

11. The transport pallet of claim 9, wherein said communication harness comprises:

receptor connectors mounted with said support tray for receiving test signals for testing the personal computer; and transfer connectors mounted with said support tray in communication with said receptor connectors for transferring test signals to the personal computer for testing.

12. The transport pallet of claim 11, wherein:

said receptor connectors and said power supply connectors are mounted with a support plate formed on an upper surface of said support tray; and said transfer connectors and said power transfer connectors are mounted with a support plate formed on a lower surface of said support tray.

13. The transport pallet of claim 12, wherein said support plates are aligned in a common vertical plane on said surfaces of said support tray.

14. The transport pallet of claim 13, further including:

a connector mechanism extending through said support tray and interconnecting said support plates of said receptor connectors and said transfer connectors.

15. A transport pallet for an electronic component during post assembly testing performed in a shelf of an automated test rack having power and test signals furnished by a supply terminal mounted in said shelf, said pallet comprising:

a support tray having an upper surface on which the electronic component being tested is placed;

a communication harness mounted with said support tray for transferring operating power and test signals to the electronic component for testing; and said communication harness including an alignment guide for aligning said communication harness with said supply terminal.

16. A transport pallet for an electronic component during post assembly testing, comprising:

a support tray having an upper surface on which the electronic component being tested is placed; and a communication harness mounted with said support tray for transferring operating power and test signals to the electronic component for testing; and a memory device mounted with said communication harness for storing results of testing of the component.

17. An automated post-assembly testing system for electronic components, comprising:

a test rack having a plurality of test shelves;

said test shelves having a supply terminal with a power supply for providing operating power for testing a component and a test signal source of test signals for the component;

a transport pallet receiving one of the electronic components, said transport pallet being movable into one of said test shelves for testing of the component thereon, said transport pallet comprising:

a support tray having an upper surface on which the component being tested is placed; and a communication harness mounted with said support tray for transferring operating power and test signals to the component for testing; and an alignment guide for aligning said communication harness with said supply terminal.

18. The testing system of claim 17, wherein said communication harness comprises:

receptor connectors mounted with said support tray for receiving test signals for testing the component; and transfer connectors mounted with said support tray in communication with said receptor connectors for transferring test signals to the component for testing.

19. The testing system of claim 17, wherein said communication harness comprises:

power supply connectors mounted with said support tray for receiving external operating power for the component during testing; and power transfer connectors in electrical connection with said power supply connectors for furnishing the external operating power to the component during testing.

20. The testing system of claim 17, wherein said electronic component comprises a personal computer.

21. A transport pallet for an electronic component during post-assembly testing, comprising:

a support tray comprising an upper tray shell and a lower tray shell formed together having an inner opening therein containing a foamed synthetic resin;

said upper tray shell having an upper surface on which the component being tested is placed;

a communication harness mounted with said support tray for transferring operating power and test signals to the component for testing; and a memory device mounted with said communication harness for storing results of testing of the component.

22. The transport pallet of claim 21, wherein said lower tray shell has a lower surface and said communication harness comprises:

an upper support plate mounted on said upper surface of said upper tray shell;

receptor connectors mounted with said upper support plate for receiving test signals for testing the component;

a lower support plate mounted on a lower surface of said support tray; and transfer connectors mounted with said support plate in communication with said receptor connectors for transferring test signals to the component for testing.

23. The transport pallet of claim 22, wherein said communication harness comprises:

power supply connectors mounted with said lower support plate for receiving external power for the component during testing; and power transfer connectors mounted with said upper support plate in electrical connection with said power supply connectors for furnishing the external power to the component during testing.

24. The transport pallet of claim 23, wherein said upper and lower support plates are aligned in a common vertical plane on said surfaces of said support tray.

25. The transport pallet of claim 24, further including:

a connector mechanism extending through said support tray and interconnecting said support plates of said receptor connectors and said transfer connectors.

26. The testing system of claim 21 further including:

a memory device mounted with said communication harness for storing results of testing of the component.

* * * * *